United States Patent
Wang et al.

(10) Patent No.: US 7,893,788 B2
(45) Date of Patent: Feb. 22, 2011

(54) CHARGE PUMP-BASED FREQUENCY MODULATOR

(75) Inventors: Ping-Ying Wang, Hsinchu (TW); Hsiu-Ming Chang, Tainan (TW)

(73) Assignee: Mediatek Inc., Hsin-Chu (TW)

( * ) Notice: Subject to any disclaimer, the term of this patent is extended or adjusted under 35 U.S.C. 154(b) by 93 days.

(21) Appl. No.: 12/369,766

(22) Filed: Feb. 12, 2009

(65) Prior Publication Data

US 2009/0206941 A1    Aug. 20, 2009

Related U.S. Application Data

(60) Provisional application No. 61/029,605, filed on Feb. 19, 2008.

(51) Int. Cl.
H03C 3/06 (2006.01)

(52) U.S. Cl. ................. 332/128; 332/136

(58) Field of Classification Search ............ 332/117, 332/123, 124, 127, 128, 136, 144, 146; 331/23, 331/1 A, 17; 375/295, 302
See application file for complete search history.

(56) References Cited

U.S. PATENT DOCUMENTS

| | | | |
|---|---|---|---|
| 7,643,572 B2 * | 1/2010 | Puma | 375/295 |
| 2007/0035354 A1 * | 2/2007 | Chan et al. | 332/127 |
| 2009/0174491 A1 * | 7/2009 | Wang et al. | 331/1 A |

* cited by examiner

Primary Examiner—Robert Pascal
Assistant Examiner—Ryan Johnson
(74) Attorney, Agent, or Firm—Thomas, Kayden, Horstemeyer & Risley (57) ABSTRACT

A charge pump-based frequency modulator is provided. The charge pump-based frequency modulator comprises an analog phase correction path comprising a varactor and a charge pump. The varactor is coupled to an output of the charge pump-based frequency modulator. The charge pump is coupled to a node between the varactor and the output and receives a signal containing the modulated data.

23 Claims, 9 Drawing Sheets

CHARGE PUMP-BASED FREQUENCY MODULATOR

CROSS REFERENCE TO RELATED APPLICATIONS

This application claims the benefit of U.S. Provisional Application No. 61/029,605, filed on Feb. 19, 2008.

BACKGROUND OF THE INVENTION

1. Field of the Invention

The invention relates to a phase locked loop (PLL) and, in particular, to a PLL with a charge pump-based frequency modulator.

2. Description of the Related Art

The most popular architecture used for frequency/phase modulation is a closed loop modulator with a digital pre-emphasis filter. Although most of the phase locked loop (PLL) circuits work in the digital domain, the PLL transfer function, which consists of analog components, is still required, to design a pre-emphasis filter for obtaining high modulation bandwidth. The mismatch between the pre-emphasis filter and the PLL closed-loop transfer function induces phase errors. To minimize phase errors, accurate PLL dynamics need to be captured and associated loop parameters must be calibrated and controlled with additional adaptive circuitry. Several circuit topologies have been disclosed by various researchers to alleviate this mismatch problem such as using switching capacitor circuits with active devices and a type I loop filter, automatic calibration architecture, and a frequency discriminator. Although mismatch can be minimized through such design efforts, loop filter calibration is still required to minimize phase error, thus, increasing complexity of circuit implementation. Additionally, boosting the modulation signal from the sigma-delta modulator (SDM), introduces large amounts of jitter to the PLL input. For such an example, a larger dynamic range of the charge pump circuit is required. Thus, resulting in increased noise levels due to greater clock feed-through induced by larger variations.

Another architecture for a DFM is two-point-modulation, in which high data rates are achieved by modulating the SDM and the voltage-controlled oscillator (VCO) at the same time. To achieve high fidelity modulation, a VCO gain with a large linearity range is required. However, this would increase the VCO design complexity due to the tradeoffs between linearity and gain. For two-point-modulation, accurate VCO gain calibration is unavoidable and, the phase error actually induced by the VCO gain variation is more sensitive than that of the digital pre-emphasis architecture, thus, implying that higher precision tuning is needed. No obvious solution without tuning was disclosed in the literature.

The invention discloses and verifies in silicon a hybrid time/digital fractional-N PLL in which phase errors are corrected linearly using a passive pseudo-differential circuit topology without an operational amplifier. An accurate VCO gain, which had 1 KHz resolution, was obtained by digitally calibrating the closed loop gain. Exploiting the simplicity and the calibration precision of the PLL, a programmable charge pump was incorporated in the original architecture to build a new DFM that can achieve modulation at high data rates without any of the previously mentioned drawbacks. Specifically, phases can be easily modulated using a programmable charge pump that is essentially of high bandwidth and resolution. Not only is the circuit complexity greatly reduced, but also the charge pump circuitry, as digital circuits, were shown as scaling very well. By modulating the PLL from both the SDM and the programmable charge pump, a data rate up to the PLL's theoretical limit was achieved. The strength of the disclosed architecture was supported by both analytical analysis and simulation results.

BRIEF SUMMARY OF THE INVENTION

An embodiment of a charge pump-based frequency modulator comprises an analog phase correction path comprising a varactor and a charge pump. The varactor is coupled to an output of the charge pump-based frequency modulator. The charge pump is coupled to a node between the varactor and the output and receives a signal containing the modulated data.

The invention provides a charge pump-based direct frequency modulator (DFM). Based on a hybrid time/digital fractional-N phase locked loop (PLL), the architecture has several advantages. First, the data rate was independent of the PLL loop bandwidth. Since the modulation signal does not need boosting, the digital pre-emphasis filter was removed and thus, information about the inverse transfer function of the PLL was not needed. Thus, eliminating the need for complicated calibration circuits for reducing the phase errors induced by the mismatch between the pre-emphasis filter and the PLL transfer function. Additionally, circuit complexity is further reduced because only an additional programmable charge pump is needed. Simulation results on a GMSK modulator demonstrated that the disclosed architecture can achieve data rates which are 14 times greater than the loop bandwidth.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
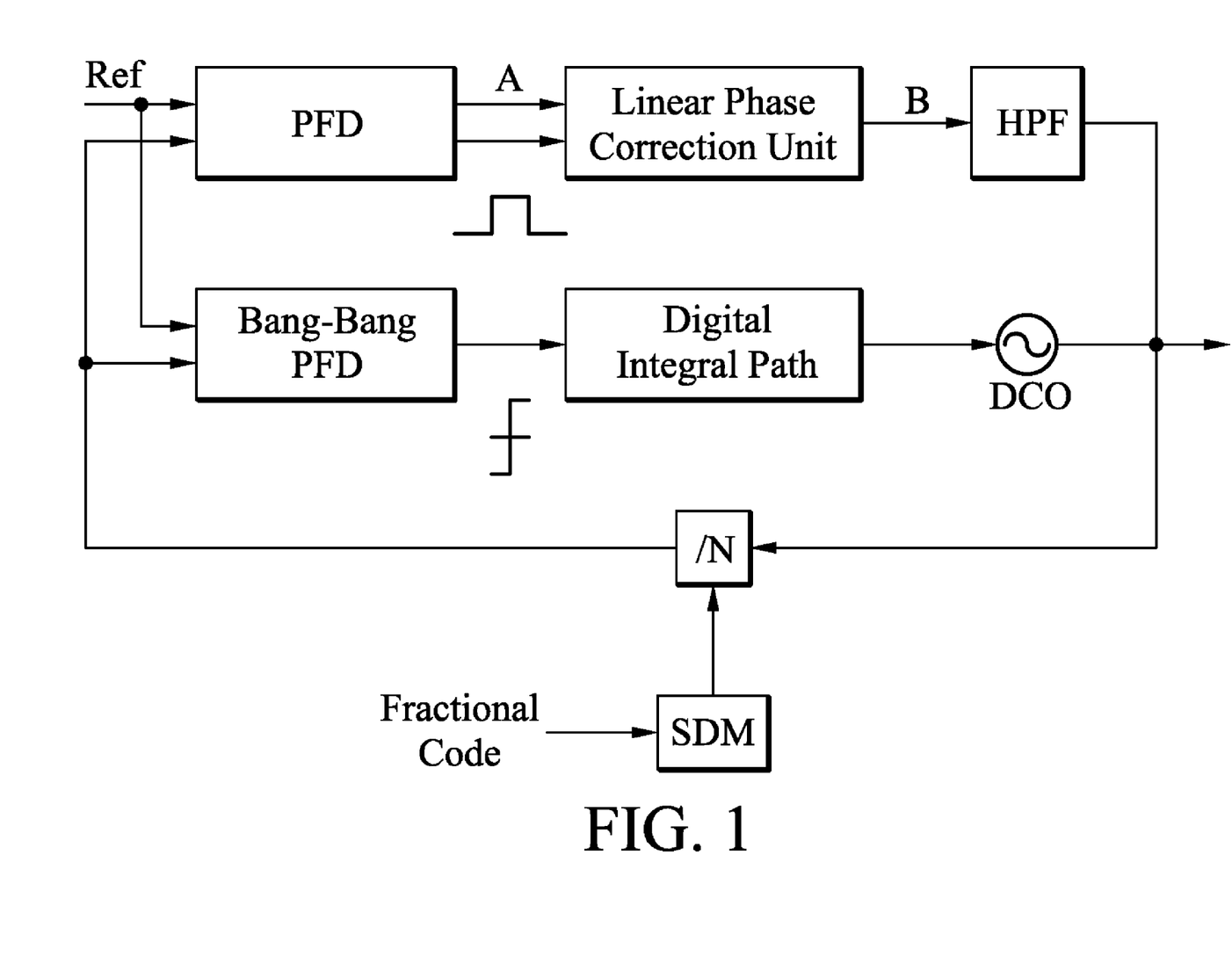
FIG. 1 is a block diagram of a hybrid-type PLL.
Figure 2:
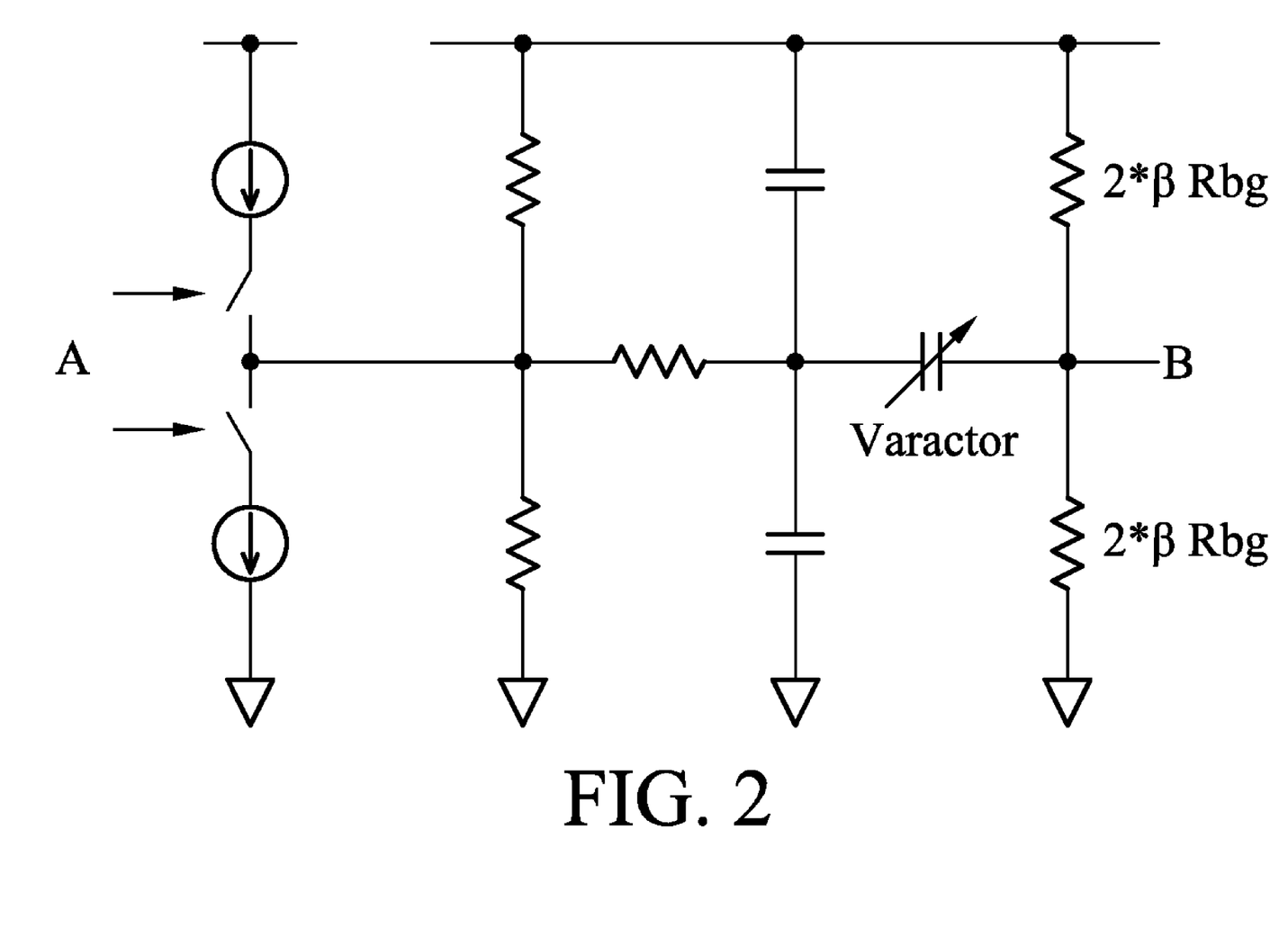
FIG. 2 is a schematic diagram of a linear phase correction unit (LPCU) according to an embodiment of the invention.

FIG. 1 is a block diagram of a hybrid time/digital synthesizer. The feed-forward portion of the PLL is separated into a time-domain proportional path and a digital domain integral path. The proportional path consists of a conventional phase-and-frequency detector (PFD) and a linear phase correction unit (LPCU). The detailed schematic of the LPCU is shown in FIG. 2. It uses a phase error signal generated by the conventional PFD to change the phase of a digitally-controlled oscillator (DCO) by controlling the capacitance of the varactor, making phase correction linearly proportional to the phase error. The common mode of the LPCU is biased at VDD/2 with the resistors' values equal to 2βRbg, where Rbg is the resistor value used in a band-gap reference. A high-pass filter is used to filter transient ripples at the LPCU output before the signal is coupled with the DCO output using AC coupling capacitors. In the integral path, the digital integral path circuits track the frequency of the reference clock in the digital domain, which is sampled by a bang-bang PFD.

The circuits have been proven in silicon. Specifically, they have been used in a fractional-N synthesizer operation in which the phase was modulated by an SDM. It should be emphasized that the circuit can perform phase modulation linearly whether the current is injected from A or B. The varactor capacitance depends only on the voltage difference between the two terminals. The modulation signal sees different closed-loop transfer functions between two modulation points. For example, at point B, the modulation signal bypasses the loop filter so that the transfer function is a high-pass filter; while at point A, the modulation signal encounters a low-pass loop filter transfer function.

The voltage-controlled oscillator (VCO) or DCO gain variation significantly affects phase error performance in a DFM application. Experiments showed that a 1% VCO gain variation will result in a 0.897-degree phase error in the disclosed DFM scheme. Inevitable process and temperature variations necessitate a precise VCO/DCO gain calibration.

Figure 3:
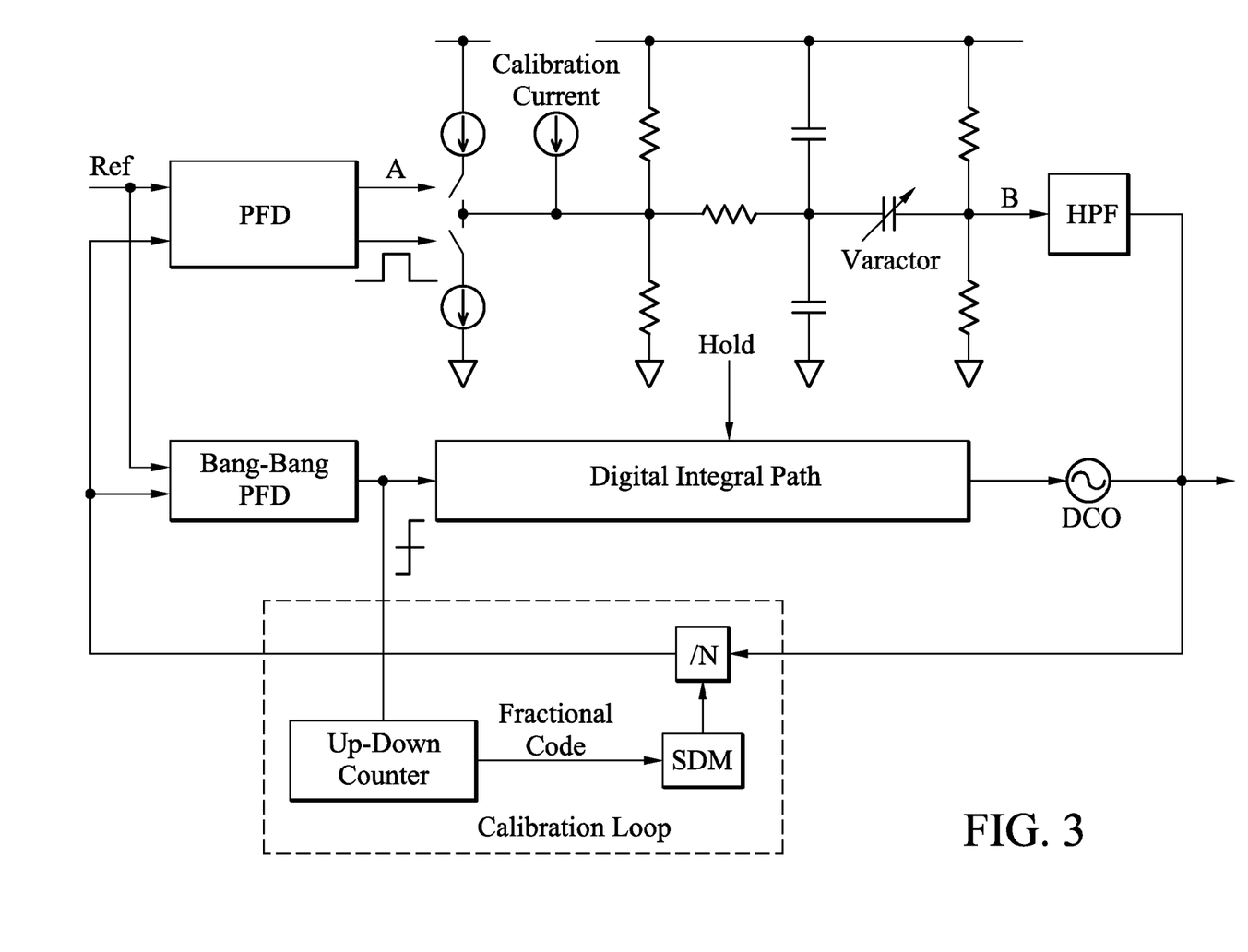
FIG. 3 is a schematic diagram showing setup of DCO/VCO gain calibration.

The schematic for the disclosed VCO/DCO gain calibration method, achieving a precision of 1 KHz calibration resolution when operating in a 26 MHz reference frequency, is illustrated in FIG. 3. During the calibration mode, a precise calibration current, mirrored from a band-gap reference with a ratio α is injected into the proportional path. The digital integral path is held constant to retain the output of the PLL at a desired channel. This causes the bang-bang PFD to generate a phase lag signal. The calibration loop will read the bang-bang PFD's output and will adjust the PLL fractional code until the bang-bang PFD indicates the possibility of a simultaneous phase lag and lead.

The amount of frequency shift ($\Delta f$) can then be calculated based on the difference between the fractional code before and after injecting the calibration current, while the amount of voltage shift ($\Delta V$) induced by the injected current is simply the current value times the loop filter resistor value. This is accurately derived from the on-chip band-gap reference. Since VCO/DCO gain is defined as the frequency change over a certain voltage value ($\Delta f/\Delta V$), we can now accurately measure and calibrate the VCO/DCO gain.

The resolution of the calibration scheme depends upon the number of bits used in the fractional code. With a 15-bit fractional code, a 1 KHz resolution is achieved, which is 26 MHz divided by $2^{15}$.

Figure 4:
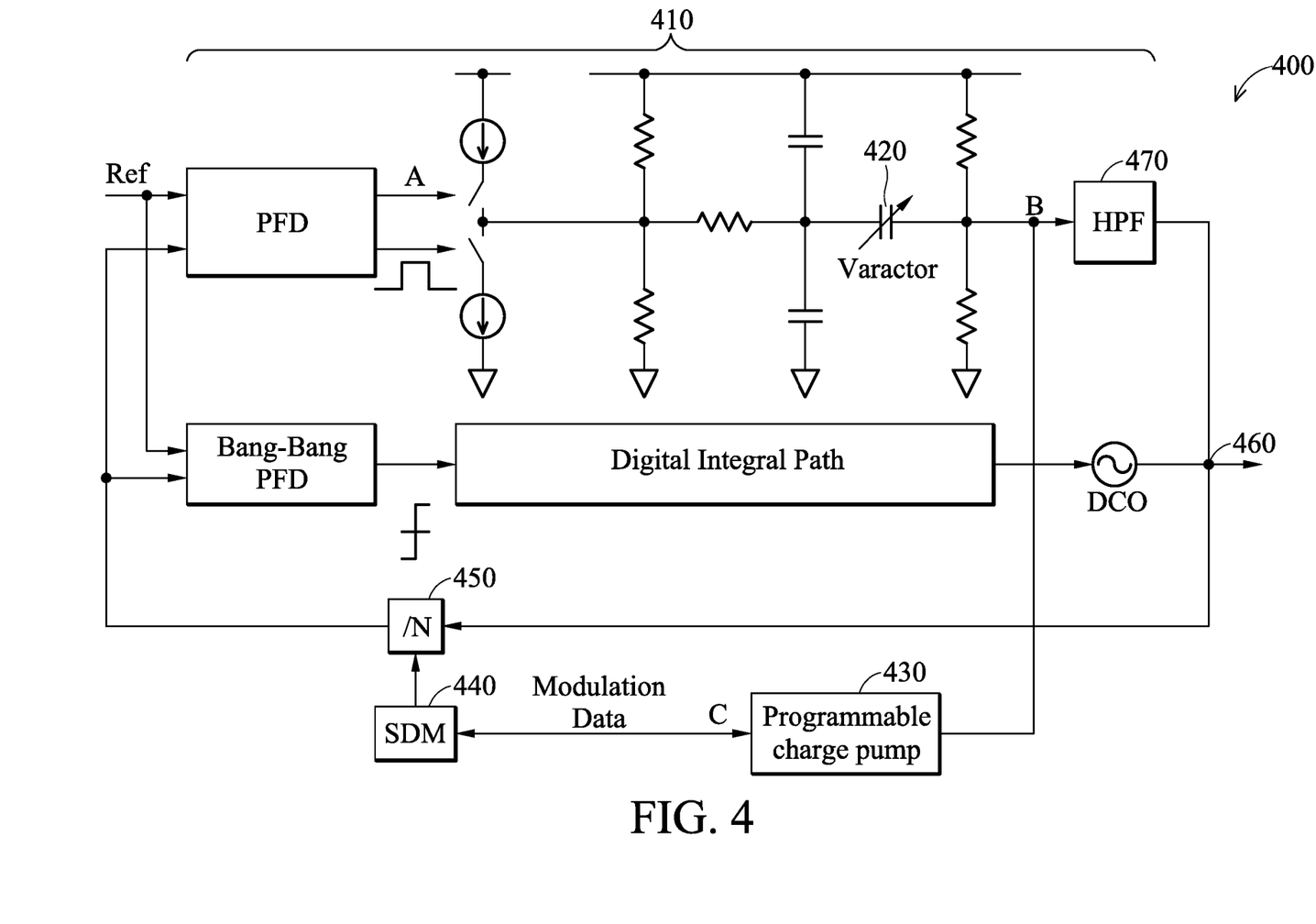
FIG. 4 is a schematic diagram of a charge pump based direct frequency modulator according to an embodiment of the invention.

The disclosed direct frequency modulator, as shown in FIG. 4, is built upon the hybrid time/digital PLL with an additional programmable charge pump circuit 430. The charge pump-based frequency modulator 400 comprises an analog phase correction path 410 comprising a varactor 420 and a charge pump. Preferably, the charge pump is a programmable charge pump circuit 430. The varactor 420 is coupled to an output 460 of the charge pump-based frequency modulator 400 via a high pass filter 470. The charge pump 430 is coupled to a node between the varactor 420 and the output 460 and receives a signal containing the modulated data C. The modulation data C not only is sent through the divider 450 using the SDM 440 as in conventional DFMs but also directly modulates the varactor 420 using a programmable charge pump circuit 430. In this DFM, the modulation data C need not be compensated through a pre-emphasis filter to extend the modulation bandwidth. Thus, the requirement for a precise matching between the PLL closed-loop transfer function and the pre-emphasis filter, needed for minimizing phase error, is avoided. In fact, according to simulations, only the DCO/VCO gain needs to be calibrated and a 1 KHz resolution is achievable using the previously mentioned calibration method. Therefore, circuit complexity is greatly reduced since the use of the pre-emphasis filter and its accompanying complex calibration circuit is eliminated.

Figure 5:
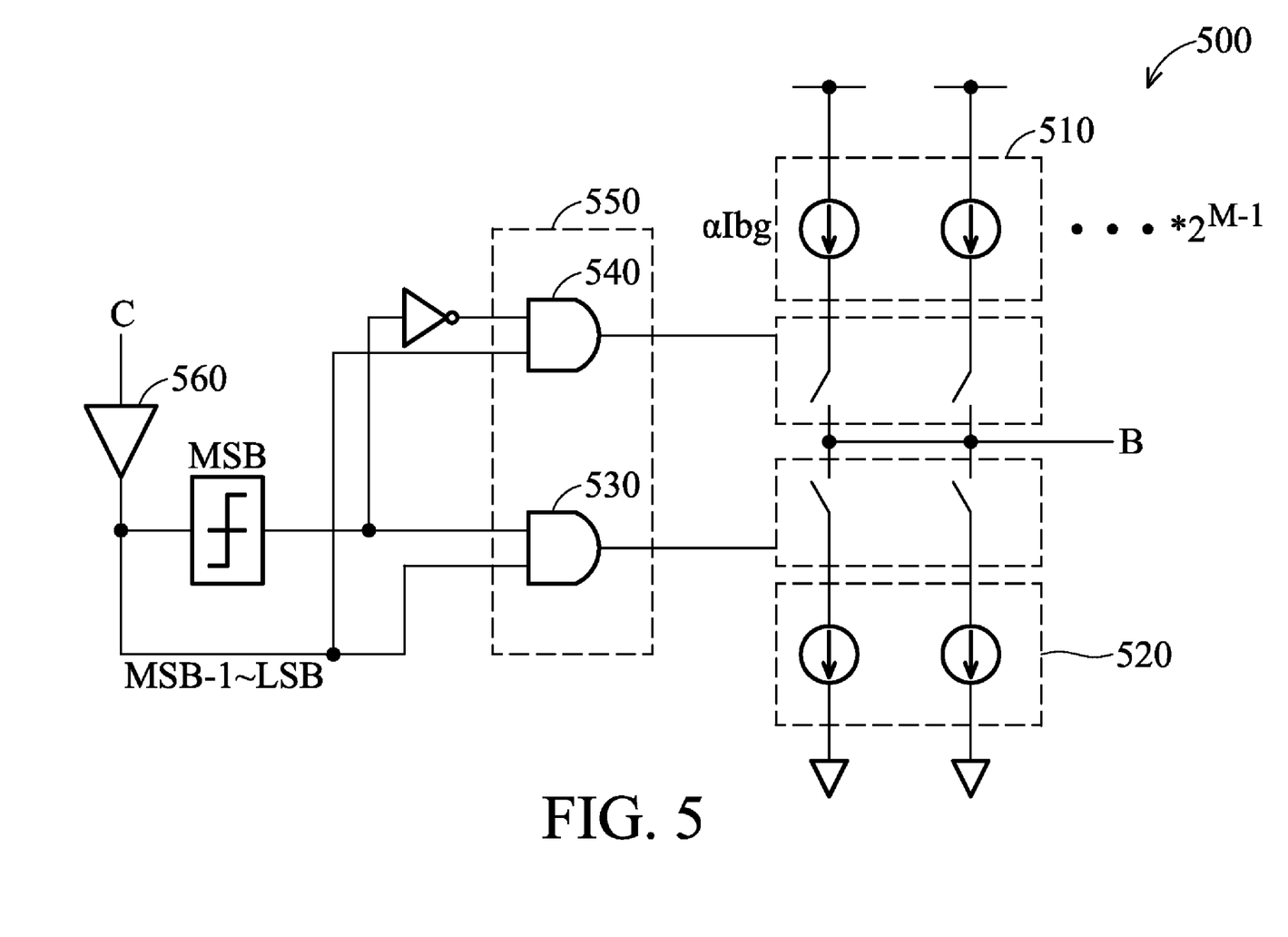
FIG. 5 is a schematic diagram of a programmable charge pump circuit in FIG. 4.

The detailed schematic of the programmable charge pump is shown in FIG. 5. The programmable charge pump circuit 500 comprises a logic circuit receiving the signal C containing the modulated data and a plurality of pull-up current sources 510 and a plurality of pull-down current sources 520 selectively coupled to the node B according to control signals from the logic circuit 550. More specifically, the logic circuit 550 comprises a first AND gate 530 receiving a most significant bit MSB and the remaining bits MSB-1~LSB of the signal containing the modulated data and a second AND gate 540 receiving an inverse of the most significant bit MSB and the remaining bits MSB-1~LSB of the signal containing the modulated data, wherein outputs of the first and second AND gate are used to control one of each and remaining pull-up current sources 510 and pull-down current sources 520. The input of the block is the modulation signal C, of which the most-significant bit (MSB) is a sign bit. The modulation data is first normalized by a multiplier 560 with a gain factor equal to the ratio of the reference signal frequency (in Hz) and the VCO gain (in Hz/V). The MSB of this normalized data is then extracted as a control bit to determine whether a positive or a negative current should be pumped to the output. The rest of the data, —the MSB-1 bit to the least-significant bit (LSB)— is used to determine the number of closed switches in the charge pump array. The magnitude of the injected current is proportional to the number of charge pumps connected to the output. The total number of charge pumps is $2^{M-1}$, which corresponds to the M bits used to represent the normalized modulation data. Since the charge pumps are mirrored from a band-gap reference, unit current mismatch can be controlled within 1%. The unit current is expressed as αIbg; where Ibg is the band-gap reference current and α is the mirrored ratio in FIG. 5. The simulation result showed that a 1% mismatch of the top and bottom current source will lead to a less than 0.7 degree rms phase error.

Figure 6:
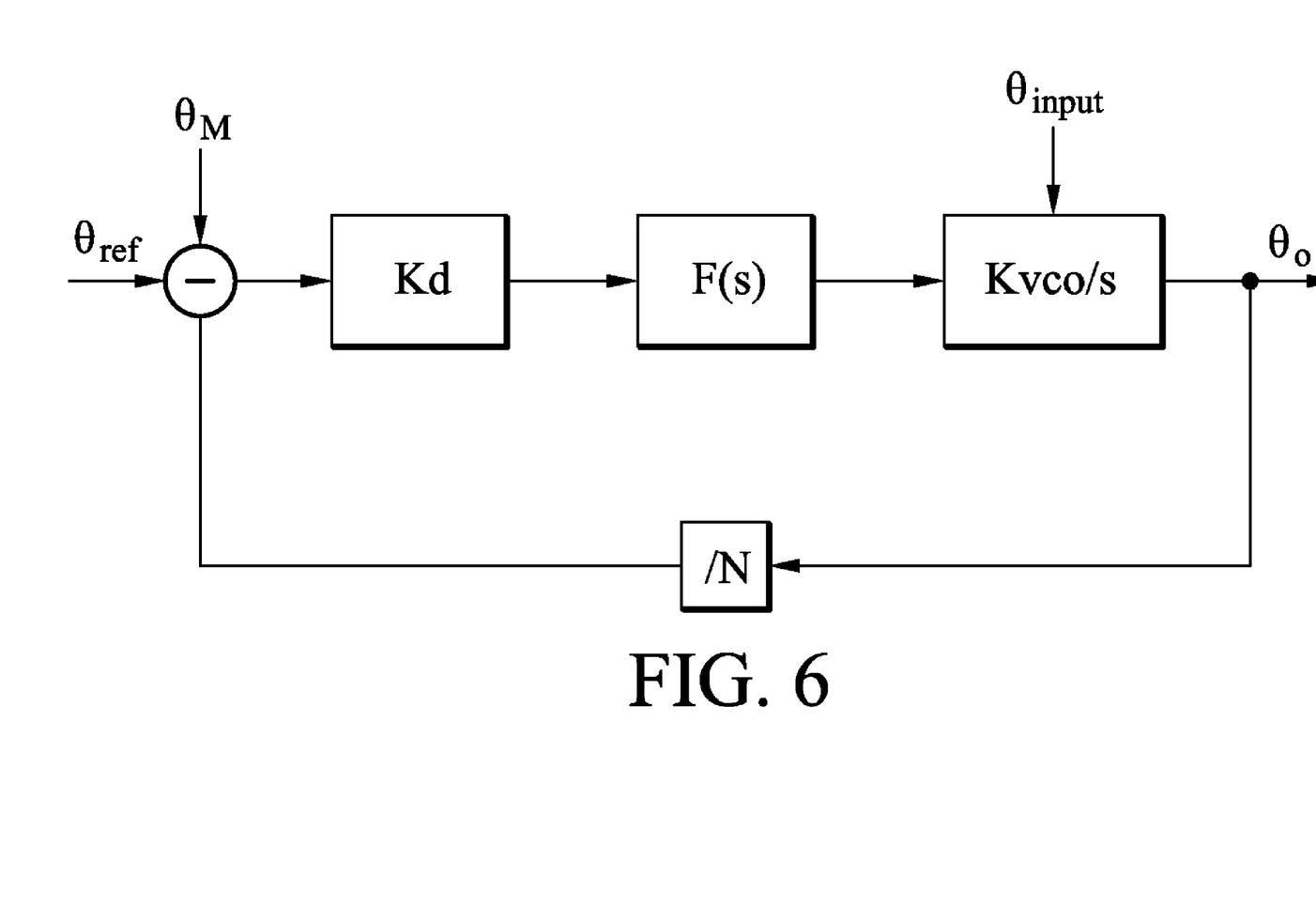
FIG. 6 is a schematic diagram showing the s-domain model of the charge pump based direct frequency modulator according to an embodiment of the invention.

The s-domain model of the disclosed DFM is shown in FIG. 6. The closed loop transfer function of the signal θm that modulates the SDM is:

$$\frac{\theta_o}{\theta_M} = \frac{H(s)}{s + H(s)/N}, \quad (1)$$

where $H(s) = K_d \cdot K_{vco} \cdot F(S)$ is the open loop transfer function. Moreover, a differentiated phase signal that modulates the varactor has a closed loop transfer function:

$$\frac{\theta_o}{\theta_{input}} = \frac{s}{s + H(s)/N}, \quad (2)$$

where θ input is an equivalent input signal at the output of the VCO and is equal to the differentiated modulation signal dθm/dt multiplied by a factor fref/Kvco. The disclosed modulation scheme is the combination of Eq. (1) and Eq. (2) scaled using the appropriate factor:

$$\frac{1}{N} \cdot \frac{\theta_o}{\theta_M} + \frac{\theta_o}{\theta_{input}} = 1. \quad (3)$$

Eq. (3) represents an all-pass characteristic that enables the disclosed DFM to modulate data of any rate and is independent of the loop filter dynamics. Intuitively, although high frequency data that modulates the SDM is suppressed by the limited-bandwidth low-pass loop filter, the filtered high frequency information can be compensated using the modulation data through the VCO path, which has high-pass characteristics.

Figure 7:
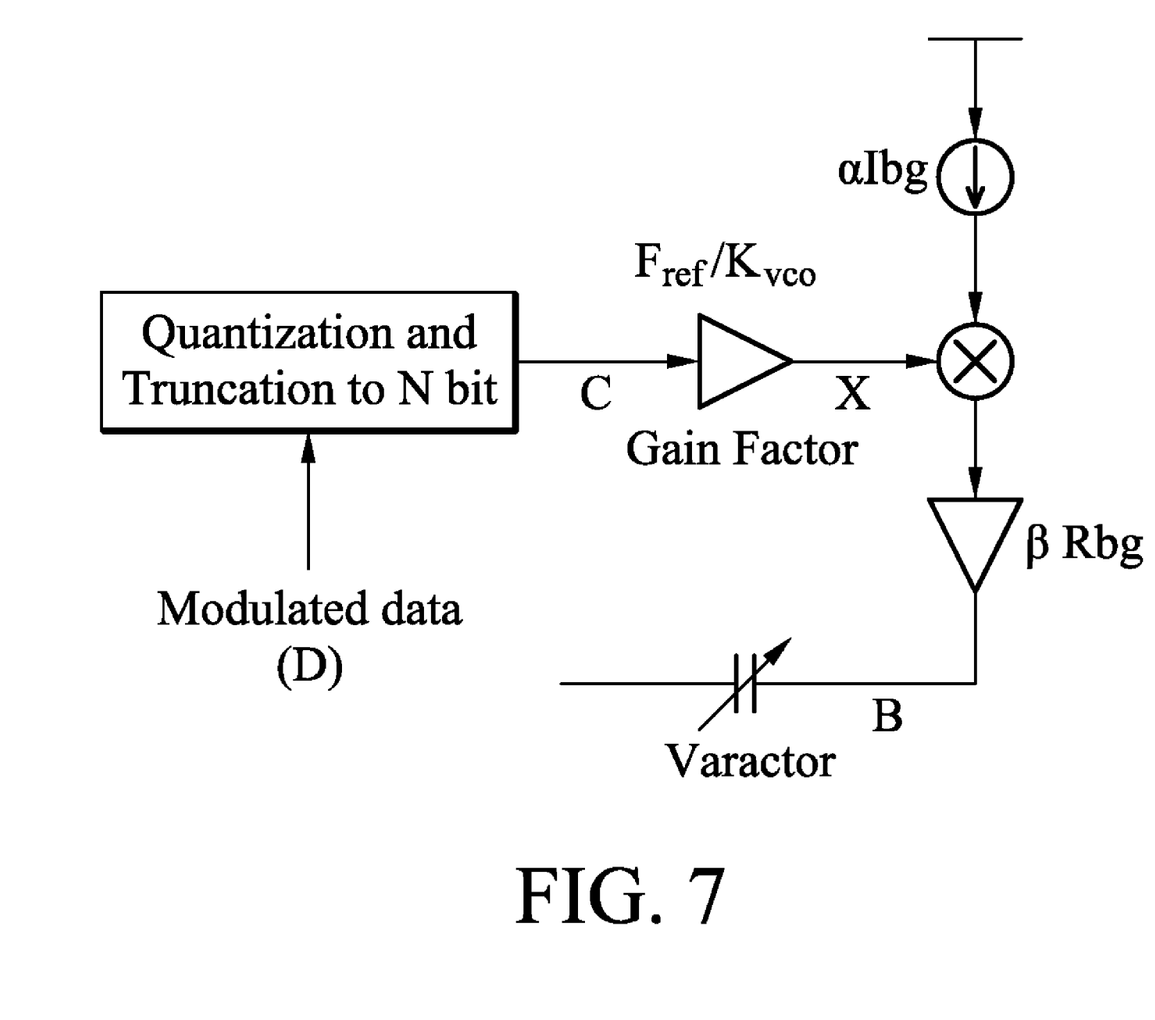
FIG. 7 is a schematic diagram showing a mathematical model of the charge pump based direct frequency modulator according to an embodiment of the invention.

The mathematic model of the functional blocks in FIG. 5 is combined with the LPCU for analysis. This combined model is shown in FIG. 7. The SDM is not included in this model to simplify the calculation. First, the digital modulation code (D) is quantized and normalized to M bits—its MSB is the sign bit —, thus, the signal at point C is:

$$D \cdot 2^{M-1} \cdot \alpha I_{bg} \cdot \beta R_{bg} / D_{max} \quad (4).$$

The signal is then multiplied with a gain factor fref/Kvco, so that the signal at point X is:

$$2^{M-1} \cdot D \cdot \frac{\alpha I_{bg} \cdot \beta R_{bg}}{D_{mzx}} \cdot \frac{f_{ref}}{K_{vco}} \cdot \alpha I_{bg}. \quad (5)$$

The voltage variation of the varactor shown in FIG. 4, due to the injected current, is the injected current multiplied by the resistance in the LPCU. The signal at point B is:

$$2^{M-1} \cdot D \cdot \frac{\alpha I_{bg} \cdot \beta R_{bg}}{D_{mzx}} \cdot \frac{f_{ref}}{K_{vco}} \cdot \alpha I_{bg} \cdot \beta R_{bg}. \quad (6)$$

The product Ibg*Rbg tracks the band-gap voltage since the resistor and current source are mirrored from the band-gap, meaning:

$$I_{bg} \cdot R_{bg} = V_{bg} \quad (7).$$

Substituting Eq. (7) into Eq. (6), we get the signal fed into DCO at point B as:

$$2^{M-1} \cdot D \cdot \frac{\alpha \cdot \beta \cdot V_{bg}}{D_{mzx}} \cdot \frac{f_{ref}}{K_{vco}} \cdot \alpha \cdot \beta \cdot V_{bg}. \quad (8)$$

It shows that the output of the programmable charge pump depends solely on the device mirror ratio α and β, the band-gap voltage Vbg and Kvco, which can be controlled and calibrated accurately as mentioned previously. The architecture can be applied to perform two-point modulation without factory tuning and can obtain wide bandwidth direct frequency modulation with the simple design.

Figure 8:
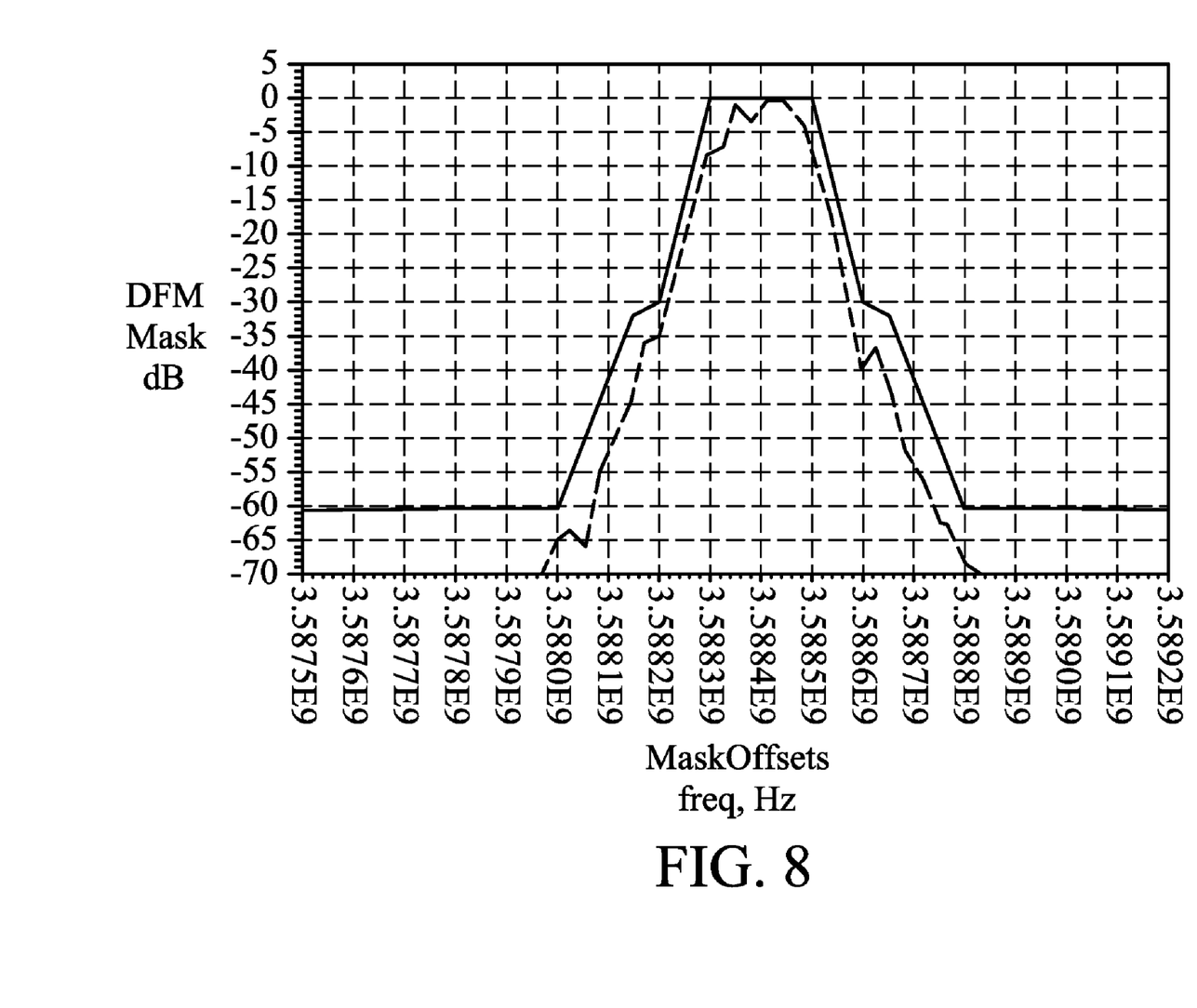
FIG. 8 is a schematic diagram showing GMSK output spectrum of the disclosed DFM with quantization error and the GSM ORFS mask requirement.
Figure 9:
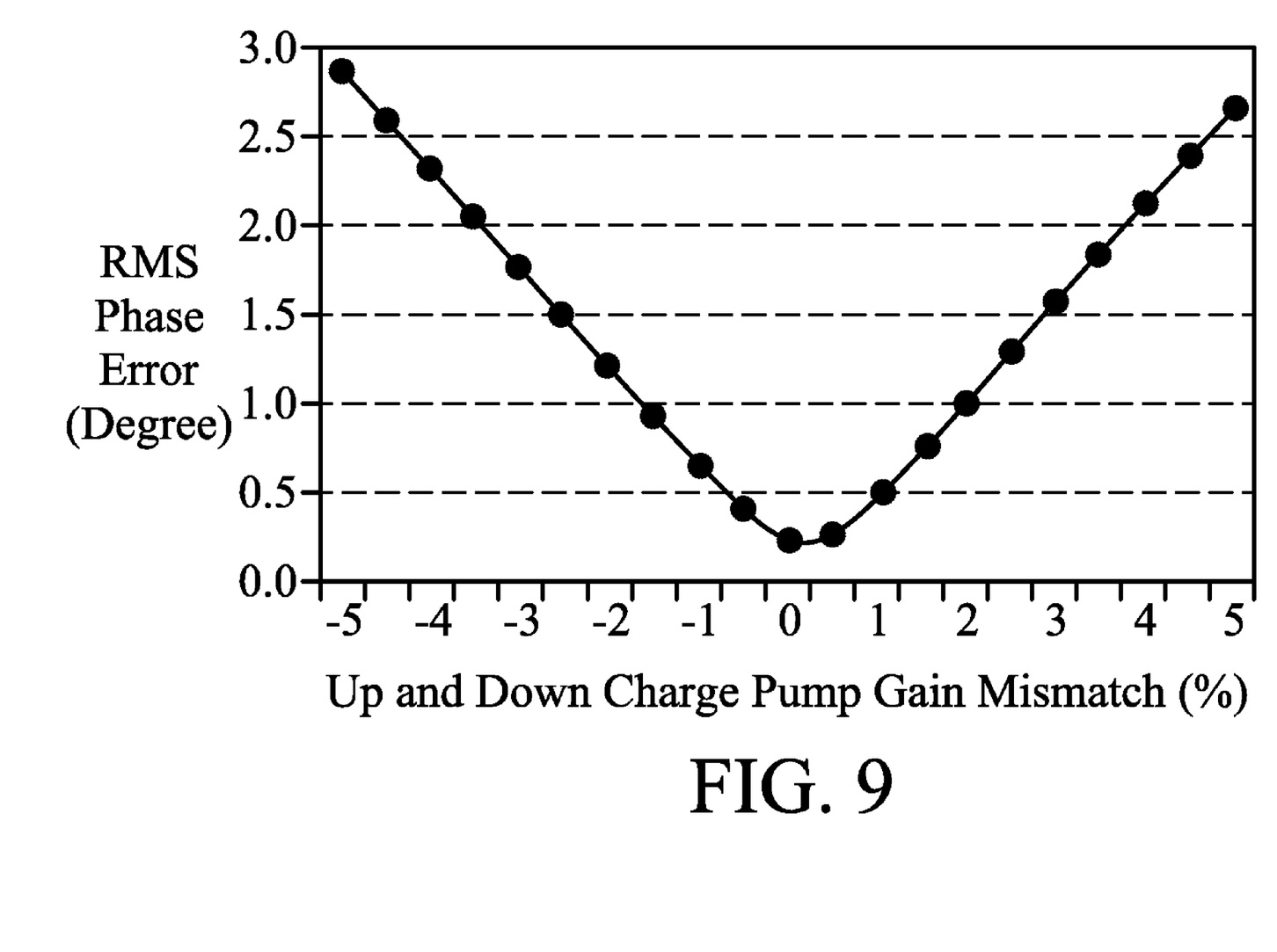
FIG. 9 is a schematic diagram showing phase error sensitivity due to the percentile gain mismatch without quantization error.

The disclosed DFM was verified with a simulation setup using the Agilent Advanced Design System for a GSM communication system. The GSM symbol rate was 270 KHz. For the PLL, Kvco=2 MHz/V for the modulation was chosen, and the loop bandwidth was around 19.1 KHz, which is less than 1/14 of the GSM symbol rate. M=5 bit was used for normalized modulation data, resulting in 16 current sources. The unit current was equal to 12.5 uA and the corresponding quantization error was 1.875 mV. The modulated spectrum signal passed the output radio-frequency spectrum (ORFS) defined by the GSM standard, as shown in FIG. 8, with an rms phase error at 0.764 degree. With a 1% gain mismatch from the up and down charge pump, an additional phase error that was less than 0.7 degree was added, as shown in FIG. 9. The combined phase error result was far below the GSM specification of five degrees.

The above-mentioned VCO gain calibration method can also be used for programmable charge pump current mismatch calibration since the frequency deviation at every code setting can be digitally measured. The current source used in the programmable charge pump can be designed without using cascade topology to obtain additional supply voltage overhead.

For circuit implementation, the charge pump unit current was chosen to be αIbg=12.5 μA and βRbg=150 Ohm. Thus, each current unit toggled 1.875 mV on the varactor. With 16 current sources, the dynamic range was only 60 mV, so VCO gain linearity wise easily achieved without adding VCO linearity calibration circuit.

The disclosed modulator is built upon the hybrid time/digital fractional-N PLL with a high resolution VCO gain calibration. The modulation scheme can also be applied to a conventional charge pump PLL by incorporating an LPCU and a programmable charge pump. The circuit topology does not include an operational amplifier and the current source is operated at fixed VDD/2, thus, allowing the transistor to keep operating in the saturation region even with the low voltages used in advanced processes.

The invention provides a charge pump-based direct frequency modulator (DFM). Based on a hybrid time/digital fractional-N phase locked loop (PLL), the architecture has several advantages. First, the data rate is independent of the PLL loop bandwidth. Since the modulation signal does not need boosting, the digital pre-emphasis filter is removed and thus, information about the PLL's inverse transfer function is not needed. This also eliminates complicated calibration circuits for reducing the phase errors induced by the mismatch between the pre-emphasis filter and the PLL transfer function. The circuit complexity is further reduced because only an additional programmable charge pump is needed. Simulation results on a GMSK modulator demonstrated that the disclosed architecture can achieve data rates of 14 times greater than the loop bandwidth.

While the invention has been described by way of example and in terms of preferred embodiment, it is to be understood that the invention is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A charge pump-based frequency modulator, comprising:
    an analog phase correction path comprising a varactor coupled to an output of the charge pump-based frequency modulator;
    a charge pump coupled to a node between the varactor and the output and receiving a signal containing modulation data; and
    a high pass filter coupled between the node and the output.

2. The charge pump-based frequency modulator as claimed in claim 1, wherein the charge pump is a programmable charge pump circuit.

3. The charge pump-based frequency modulator as claimed in claim 2, wherein the programmable charge pump circuit comprises a logic circuit receiving the signal containing the modulation data and a plurality of pull-up current sources and a plurality of pull-down current sources selectively coupled to the node according to control signals from the logic circuit.

4. The charge pump-based frequency modulator as claimed in claim 3, wherein the logic circuit comprises a first AND gate receiving a most significant bit and the remaining bits of the signal containing the modulation data and a second AND gate receiving an inverse of the most significant bit and the remaining bits of the signal containing the modulation data, wherein outputs of the first and second AND gate are used to control one of each and remaining pull-up current sources and pull-down current sources.

5. The charge pump-based frequency modulator as claimed in claim 3, wherein the signal containing the modulation data is normalized by an multiplier before being received by the logic circuit.

6. The charge pump-based frequency modulator as claimed in claim 1, further comprising a frequency divider coupled between the output and input of the charge pump-based frequency modulator and a sigma delta modulator receiving the signal containing the modulation data.

7. The charge pump-based frequency modulator as claimed in claim 1, further comprising a digital frequency correction path comprising a digital integral path circuit.

8. The charge pump-based frequency modulator as claimed in claim 1, wherein the charge pump directly connecting the varactor.

9. A charge pump-based frequency modulator, comprising:
    an analog phase correction path comprising a varactor coupled to an output of the charge pump-based frequency modulator;
    a programmable charge pump, coupled to a node between the varactor and the output, wherein the programmable charge pump circuit comprises:
        a logic circuit receiving a signal containing modulation data to generate control signals; and
        a plurality of pull-up current sources and a plurality of pull-down current sources selectively coupled to the node according to the control signals.

10. The charge pump-based frequency modulator as claimed in claim 9, further comprising a high pass filter coupled between the node and the output 11. The charge pump-based frequency modulator as claimed in claim 9, wherein the logic circuit comprises a first AND gate receiving a most significant bit and the remaining bits of the signal containing the modulation data and a second AND gate receiving an inverse of the most significant bit and the remaining bits of the signal containing the modulation data, wherein outputs of the first and second AND gate are used to control one of each and remaining pull-up current sources and pull-down current sources.

12. The charge pump-based frequency modulator as claimed in claim 9, wherein the signal containing the modulation data is normalized by an multiplier before being received by the logic circuit.

13. The charge pump-based frequency modulator as claimed in claim 9, further comprising a frequency divider coupled between the output and input of the charge pump-based frequency modulator and a sigma delta modulator receiving the signal containing the modulation data.

14. The charge pump-based frequency modulator as claimed in claim 9, further comprising a digital frequency correction path comprising a digital integral path circuit.

15. The charge pump-based frequency modulator as claimed in claim 9, wherein the programmable charge pump directly connecting the varactor.

16. A charge pump-based frequency modulator, comprising:
    an analog phase correction path comprising a varactor coupled to an output of the charge pump-based frequency modulator;
    a charge pump coupled to a node between the varactor and the output and receiving a signal containing modulation data; and
    a digital frequency correction path comprising a digital integral path circuit.

17. The charge pump-based frequency modulator as claimed in claim 16, further comprising a high pass filter coupled between the node and the output.

18. The charge pump-based frequency modulator as claimed in claim 16, wherein the charge pump is a programmable charge pump circuit.

19. The charge pump-based frequency modulator as claimed in claim 18, wherein the programmable charge pump circuit comprises a logic circuit receiving the signal containing the modulation data and a plurality of pull-up current sources and a plurality of pull-down current sources selectively coupled to the node according to control signals from the logic circuit.

20. The charge pump-based frequency modulator as claimed in claim 19, wherein the logic circuit comprises a first AND gate receiving a most significant bit and the remaining bits of the signal containing the modulation data and a second AND gate receiving an inverse of the most significant bit and the remaining bits of the signal containing the modulation data, wherein outputs of the first and second AND gate are used to control one of each and remaining pull-up current sources and pull-down current sources.

21. The charge pump-based frequency modulator as claimed in claim 19, wherein the signal containing the modulation data is normalized by an multiplier before being received by the logic circuit.

22. The charge pump-based frequency modulator as claimed in claim 16, further comprising a frequency divider coupled between the output and input of the charge pump-based frequency modulator and a sigma delta modulator receiving the signal containing the modulation data.

23. The charge pump-based frequency modulator as claimed in claim 16, wherein the charge pump directly connecting the varactor.

* * * * *